(12) United States Patent
Makinson et al.

(10) Patent No.: US 8,040,664 B2
(45) Date of Patent: Oct. 18, 2011

(54) METER WITH INTEGRATED HIGH CURRENT SWITCH

(75) Inventors: David N. Makinson, Seneca, SC (US);
Firoz Narsidani, Central, SC (US);
Kirby K. Nelson, Seneca, SC (US);
Joseph Pontin, Seneca, SC (US);
Michael Worley, Clemson, SC (US)

(73) Assignee: Itron, Inc., Liberty Lake, WA (US)

( * ) Notice: Subject to any disclaimer, the term of this patent is extended or adjusted under 35 U.S.C. 154(b) by 246 days.

(21) Appl. No.: 12/473,608

(22) Filed: May 28, 2009

(65) Prior Publication Data

US 2009/0294260 A1 Dec. 3, 2009

Related U.S. Application Data

(60) Provisional application No. 61/057,623, filed on May 30, 2008, provisional application No. 61/057,632, filed on May 30, 2008.

(51) Int. Cl.
*H02B 1/00* (2006.01)
*G01R 7/00* (2006.01)
*G01R 11/32* (2006.01)

(52) U.S. Cl. ......... 361/661; 361/663; 439/517; 324/142

(58) Field of Classification Search .......... 361/659–672; 439/517; 324/142
See application file for complete search history.

(56) References Cited

U.S. PATENT DOCUMENTS

| | | | |
|---|---|---|---|
| 1,139,956 A | 5/1915 | Craft | |
| 1,958,159 A | 5/1934 | Bresson | |
| 2,021,041 A | 11/1935 | Altamura | |
| 2,558,188 A | 6/1951 | Mcwilliams | |
| 2,903,540 A | 9/1959 | Gloviak et al. | |

(Continued)

FOREIGN PATENT DOCUMENTS

CH 281257 2/1952

(Continued)

OTHER PUBLICATIONS

International Search Report for PCT International Application No. PCT/US2009/045554 mailed Jul. 29, 2009.

(Continued)

*Primary Examiner* — Ramon M Barrera
(74) *Attorney, Agent, or Firm* — Dority & Manning, P.A.

(57) ABSTRACT

Disclosed are apparatus and methodology for integrating directly within an electricity meter components corresponding to a high current switch. Line and load terminals forming a portion of the high current switch also correspond to line and load terminals configured for insertion into an electricity meter socket. Plural pairs of spring elements are connected at one end thereof to the meter load terminal while the opposite ends of the spring elements carry contacts configured to cooperate with matching contacts on a conductive support. The conductive support is coupled to the line terminal by a further conductive bar that is configured to support a flux-concentrating core for measurement of current flow through the high current switch. The present subject matter has to do with integrating a service disconnect switch directly into the base of a meter so as to provide a dual functionality component. The integrated switch is configured so as to cooperate with, for example, current sensing components to provide a fixture to secure the current sensing core which can then focus a flux field onto a Hall cell mounted on the metrology printed circuit board.

12 Claims, 3 Drawing Sheets

U.S. PATENT DOCUMENTS

| | | | |
|---|---|---|---|
| 2,931,876 A | 4/1960 | Weinfurt | |
| 3,378,663 A | 4/1968 | Abramowitz | |
| 3,381,105 A | 4/1968 | Mortenson | |
| 3,632,935 A | 1/1972 | Stegmaier | |
| 3,689,856 A | 9/1972 | Lambert et al. | |
| 3,751,618 A | 8/1973 | Hallerberg | |
| 3,842,228 A | 10/1974 | Green | |
| 3,902,032 A | 8/1975 | Koepke | |
| 4,006,323 A | 2/1977 | Nelson et al. | |
| 4,087,669 A | 5/1978 | Sauer | |
| 4,178,572 A | 12/1979 | Gaskill et al. | |
| 4,230,388 A | 10/1980 | Thierry et al. | |
| 4,240,030 A | 12/1980 | Bateman et al. | |
| 4,309,581 A | 1/1982 | Macaire et al. | |
| 4,321,436 A | 3/1982 | McGarrity | |
| 4,357,509 A | 11/1982 | Adlerteg | |
| 4,412,116 A | 10/1983 | Golub | |
| 4,490,593 A | 12/1984 | Cook | |
| 4,550,232 A | 10/1985 | Lemmer | |
| 4,562,323 A | 12/1985 | Belbel et al. | |
| 4,597,619 A | 7/1986 | Reimer | |
| 4,621,303 A | 11/1986 | Rowe | |
| 4,801,772 A | 1/1989 | Bratkowski et al. | |
| 5,021,760 A | 6/1991 | Krubsack et al. | |
| 5,045,969 A * | 9/1991 | Menasco | 361/672 |
| 5,227,750 A | 7/1993 | Connell et al. | |
| 5,296,660 A | 3/1994 | Morel et al. | |
| 5,296,662 A | 3/1994 | Engdahl et al. | |
| 5,546,269 A * | 8/1996 | Robinson et al. | 361/660 |
| 5,572,396 A * | 11/1996 | Robinson | 361/117 |
| 5,575,309 A | 11/1996 | Connell | |
| 5,583,471 A | 12/1996 | Weiser et al. | |
| 5,586,913 A * | 12/1996 | Robinson et al. | 439/638 |
| 5,608,598 A | 3/1997 | Dieppedalle et al. | |
| 5,668,538 A | 9/1997 | Warwick | |
| 5,694,099 A | 12/1997 | Connell et al. | |
| 5,821,481 A | 10/1998 | Neubauer | |
| 5,853,305 A | 12/1998 | Bedrossian et al. | |
| 5,886,860 A | 3/1999 | Chen | |
| 5,952,739 A | 9/1999 | Grass et al. | |
| 6,034,585 A | 3/2000 | Donhauser | |
| 6,046,660 A | 4/2000 | Gruner | |
| 6,046,661 A | 4/2000 | Reger et al. | |
| 6,080,949 A | 6/2000 | Weber et al. | |
| 6,104,586 A | 8/2000 | Robinson | |
| 6,246,306 B1 | 6/2001 | Gruner | |
| 6,252,478 B1 | 6/2001 | Gruner | |
| 6,292,075 B1 | 9/2001 | Connell et al. | |
| 6,320,485 B1 | 11/2001 | Gruner | |
| 6,441,332 B1 | 8/2002 | Crawford et al. | |
| 6,520,798 B1 * | 2/2003 | Robinson et al. | 439/517 |
| 6,563,409 B2 | 5/2003 | Gruner | |
| 6,661,319 B2 | 12/2003 | Schmelz | |
| 6,788,176 B2 | 9/2004 | Schmelz | |
| 6,906,637 B2 | 6/2005 | Martin | |
| 7,049,932 B2 | 5/2006 | French et al. | |
| 7,130,722 B2 | 10/2006 | Soni | |
| 7,265,652 B2 | 9/2007 | Ying | |
| 7,271,987 B1 | 9/2007 | Zhang et al. | |
| 7,362,232 B2 | 4/2008 | Holle et al. | |
| 7,458,846 B2 * | 12/2008 | Loehr et al. | 439/517 |
| 7,833,034 B2 | 11/2010 | Connell | |
| 2002/0050885 A1 | 5/2002 | Gruner | |
| 2005/0162149 A1 | 7/2005 | Makinson et al. | |
| 2005/0174256 A1 | 8/2005 | Berg | |
| 2006/0066425 A1 | 3/2006 | Gruner | |

FOREIGN PATENT DOCUMENTS

| | | |
|---|---|---|
| DE | 619902 | 10/1935 |
| DE | 1753688 | 10/1957 |
| EP | 0532586 | 4/1996 |
| EP | 0714549 | 5/1998 |
| EP | 0643813 | 6/1998 |
| GB | 1384294 | 2/1975 |
| WO | WO 91/19314 | 12/1991 |
| WO | WO 94/23230 | 10/1994 |
| WO | WO 95/05671 | 2/1995 |
| WO | WO/98/40898 | 9/1998 |
| WO | WO 03/046936 | 6/2003 |
| WO | WO 03/049129 | 6/2003 |
| WO | WO 2005/106907 | 11/2005 |
| WO | WO 2006/024855 | 3/2006 |
| WO | WO 2006/035235 | 4/2006 |

OTHER PUBLICATIONS

Machine translation of DE 619902 listed above, Jan. 27, 2011.
Machine translation of CH 281257 listed above, Jan. 27, 2011.
BLP, "X-Pulse: Introducing the New Residential Total Disconnect/Reconnect System", Power & Utilities brochure.
Thomas E. Browne, Jr., Editor; "Circuit Interruption Theory and Techniques", Westinghouse Research and Development Center, Pittsburgh, Pennsylvania, Copyright 1984 by Marcel Dekker, Inc.
Slade, Electric Contact Phenomena, pp. 586-593.

* cited by examiner

METER WITH INTEGRATED HIGH CURRENT SWITCH

PRIORITY CLAIMS

This application claims the benefit of previously filed U.S. Provisional Patent Application entitled "Compact Meter With Integrated High Current Switch," assigned U.S. Ser. No. 61/057,623, filed May 30, 2008, and claims the benefit of previously filed U.S. Provisional Patent Application entitled "Actuator/Wedge Improvements To Embedded Meter Switch," assigned U.S. Ser. No. 61/057,632, filed May 30, 2008, both of which are incorporated herein by reference for all purposes.

FIELD OF THE INVENTION

The present subject matter relates to metrology. More specifically, the present subject matter relates to electricity meters incorporating high current switch stricture integrated directly into the meter base.

BACKGROUND OF THE INVENTION

Various metrology devices have been made available over the years incorporating many useful features. Many recent advances have included various forms of automated meter reading (AMR) meters and associated networks that provide metrology devices capable of tracking, storing, and reporting data on many aspects of meter operation and power consumption or generation.

In several of the presently provided devices, a single residential electricity meter may also be configured to collect and transmit data relevant to other utility usage in a residential environment including, natural gas and water usage in addition to electrical usage. Such electricity meters are sometimes also referred to as revenue meters, watt-hour meters, and/or utility meters.

More recently, there has been identified a desire to more conveniently control service connections at a residential location. In many instances, for example, when electrical or other utility service is initially provided at a residence, such provision required a technician to visit the location to physically install the meter. Likewise, discontinuation of the service required yet another visit to the location to remove the meter. In certain instances, such as apartment locations, these required cite location visits could involve many man-hours over the course of a year.

To address these time consuming efforts, metrology devices have developed to the point where switches have been associated with the meter either as external separate entities or as self contained devices positioned within the meter housing. In spite of these improvements, however, there remains a desire to more fully integrate the measurement function and circuit interruption functions, both of which are required to respond to residential as well as business energy supply issues.

U.S. Pat. No. 7,362,232 (Holle et al.) discloses an arrangement for use in an electrical utility meter that includes a metering unit, a service disconnect circuit, and a housing assembly. The service disconnect circuit includes a self-contained switch mounted within the base portion of the metering unit. Another example of a service disconnect circuit can be found in U.S. Pat. No. 7,130,722 (Soni), which concerns an adapter apparatus containing a disconnect switch. The adapter device is configured for placement between the meter and the meter socket so that neither the meter nor the socket has to be modified to accommodate the adapter.

U.S. Pat. Nos. 6,906,637 (Martin), 6,104,586 (Robinson), 5,952,739 (Grass et al.), and 4,240,030 (Bateman et al.) and US Patent Application Publication US 2005/0174256 (Berg) all disclose variations on collocated switches within meter housing or adapter type devices designed for placement between an existing meter and a meter socket.

While various implementations of metrology devices have been developed, and while various combinations of metrology devices and service controlling switch mechanisms have been proposed, no design has emerged that generally encompasses all of the desired characteristics as hereafter presented in accordance with the subject technology.

SUMMARY OF THE INVENTION

In view of the recognized features encountered in the prior art and addressed by the present subject matter, an improved metrology device has been provided that directly integrates a high current switching circuit within a utility meter. The high current circuit, in accordance with present disclosure, is a low material usage system comprised of components that integrally function as the current carrying conductors and the circuit interruption mechanics. The high current switching device is configured to provide physical support for a flux-concentrating core so that when incorporated into a meter base, the flux-concentrating core is positioned to focus a flux field onto a Hall cell mounted on the metrology printed circuit board (PCB).

In an exemplary configuration, the high current circuit elements correspond to a line side terminal assembly and a load side terminal assembly. The line side and load side terminal assemblies respectively may be electrically connected or separated by one or more contact pairs. In an exemplary configuration, four contact pairs may be provided with one contact of each of the four pairs positioned on a contact supporting bar coupled to the line side terminal assembly and the other contact of each of the four pairs of contacts positioned on one end of one of four spring members. The other end of each of the four spring members is attached to the load side terminal.

In one exemplary configuration, the spring members supporting contacts on one end thereof are provided in pairs such that current flowing from the line side terminal to the load side terminal is divided into two sets of two parallel paths, respectively situated on each side of the contact supporting member. The switch formed by the plurality of contact pairs may be opened by forcing an insulative wedge between portions of the spring pairs to thereby separate the corresponding contacts, thereby interrupting any current flow through the high current circuit elements.

Another positive aspect of such present subject matter is that a switch cover is used to hold the switch components together along with the base, and is used to provide switch debris containment as well as terminal pushout protection. Such present combination results in a total materials usage much less than that of simply a meter with a switch attached.

One present exemplary embodiment relates to a utility meter having a service disconnect switch integrated into the base thereof. Such meter preferably may comprise a metrology board; a base integrally including high current circuit elements corresponding to a line side terminal assembly and a load side terminal assembly each respectively configured for insertion into a utility meter socket; a conductive support coupled to such line side terminal assembly; contacts supported on such conductive support; at least two pairs of spring elements respectively connected at one end thereof to the meter load terminal, with the opposite ends of such spring elements carrying contacts configured for cooperation with such contacts supported on such conductive support, so as to form contact pairs of a switch; a flux-concentrating current sensing core supported on such conductive support for measurement of current flow through such high current circuit elements by focusing a flux field onto a Hall cell mounted on such meter metrology board; a solenoid having a movable actuator; and an insulative wedge configured to be moved by such movable actuator for travel between portions of the spring element pairs to thereby separate corresponding contact pairs, for interrupting any current flow through such high current circuit elements.

In some variations of the foregoing embodiment, a present utility meter may preferably further include two pairs of such contact pairs, configured such that current flowing from such line side terminal assembly to such load side terminal assembly is divided into two sets of two parallel paths, respectively situated on each side of such conductive support; and a pair of such wedges respectively associated with such movable actuator and configured so as to respectively separate such contact pairs.

In various of the present embodiments, such utility meter may comprise alternatively one of a revenue meter and a watt-hour meter, and may be further configured for collecting utility usage data for one or more of electricity, natural gas, and water consumption. In still other embodiments, a present utility meter may further include a switch cover for holding such high current circuit elements together with such base, for providing switch debris containment and terminal pushout protection. In still other present embodiments, a present utility meter may further include a fixture mounted on such conductive support, and receiving such flux-concentrating current sensing core supported thereon so as to form a gap positioned in proximity to such metrology board; and may include a Hall cell mounted on such meter metrology board, for receiving a flux field focused thereon by such flux-concentrating current sensing core, for measurement of current flow through such high current circuit elements. IN some present exemplary embodiments, such high current circuit elements may include a respective pair of such elements configured for association, via a utility meter socket with one of both lines of a residential split phase load, and two phases of a three phase load.

In another present exemplary embodiment, a metrology device may have a high current switching circuit integrated therein. Such an exemplary present metrology device may comprise respective line and load terminals forming a portion of a high current switch, and respectively configured for insertion into an electricity meter socket, so as to integrally function as high current carrying conductors and a portion of circuit interruption mechanics; a conductive support coupled to such line terminal, and supporting at least a pair of contacts thereon; and at least a pair of spring elements respectively connected at one end thereof to such load terminal, with the opposite ends of such spring elements carrying contacts configured for cooperation with such contacts supported on such conductive support, so as to form a contact pair of a switch, configured to be separated by a selectively movable insulative member associated therewith, for selective interruption of high current carried by such terminals.

Such exemplary metrology device may in some embodiments thereof further include an insulative wedge comprising a selectively movable insulative member in selective contact with such spring elements for separating such switch contact pair; and a solenoid having a movable actuator, configured for selectively moving such insulative wedge.

Still further, such present metrology device may include an electricity metering metrology board having a Hall cell mounted thereon; a flux-concentrating current sensing core supported on such conductive support for measurement of current flow through such high current carrying conductors by focusing a flux field onto such Hall cell mounted on such metrology board; two pairs of such switch contact pairs, configured such that current flowing from such line terminal to such load terminal is divided into two sets of two parallel paths, respectively situated on each side of such conductive support; and a pair of such insulative wedges respectively associated with such movable actuator and configured so as to respectively separate such contact pairs. In some of the foregoing further exemplary embodiments, such metrology device may further include at least four contact pairs and two pairs of spring elements, provided with one contact of each of such four pairs positioned on a contact supporting bar coupled to such line terminal and the other contact of each of such four pairs of contacts positioned on one end of one of such four spring members, while the respective other end of each of such four spring members is attached to such load terminal.

The present subject matter equally relates to corresponding methodology, as well as apparatus. For example, both present apparatus and methodology are for integrating directly within an electricity meter components corresponding to a high current switch. In certain present embodiments, line and load terminals forming a portion of the high current switch also correspond to line and load terminals configured for insertion into an electricity meter socket. Plural pairs of spring elements are connected at one end thereof to the meter load terminal while the opposite ends of the spring elements carry contacts configured to cooperate with matching contacts on a conductive support. The conductive support is coupled to the line terminal by a further conductive bar that is configured to support a flux-concentrating core for measurement of current flow through the high current switch.

Another present exemplary embodiment relates to present methodology for compactly integrating a high current switching circuit into the base of a utility meter. Such exemplary present methodology may comprise providing respective line and load terminals in the base of a utility meter, forming a portion of a high current switch, and respectively configured for insertion into an electricity meter socket, so as to integrally function as high current carrying conductors and a portion of circuit interruption mechanics; coupling a conductive support to the line terminal; supporting at least a pair of contacts on such conductive support; respectively connecting at least a pair of spring elements at one end thereof to the load terminal, with the opposite ends of such spring elements carrying contacts configured for cooperation with the contacts supported on the conductive support, so as to form at least one contact pair of a switch; and selectively separating such contact pair, for selective interruption of high current carried by such terminals, whereby such terminals are providing with dual functionality, resulting in a compact utility meter design.

Additional present methodology may further include providing an insulative wedge comprising a selectively movable insulative member for selective contact with such spring elements for separating such switch contact pair; and providing a solenoid having a movable actuator, configured for selectively moving such insulative wedge.

In certain present methods, such utility meter may include a metrology board having a Hall cell mounted thereon; and a flux-concentrating current sensing core supported on such conductive support for measurement of current flow through such high current carrying conductors by focusing a flux field onto the Hall cell mounted on such metrology board.

In yet further present variations, embodiments of the subject methodology may further include providing in pairs the spring members supporting contacts on one end thereof such that current flowing from the line terminal to the load terminal is divided into two sets of two parallel paths, respectively situated on each side of the conductive support, to reduce contact erosion due to any separation-induced or closure-induced arcing. Other present embodiments may encompass methodology further including providing a switch cover for holding the components together along with the meter base, and to provide switch debris containment and terminal push-out protection; and providing a second pair of such terminals respectively configured for association, via a utility meter socket, with one of both lines of a residential split phase load, and two phases of a three phase load; and/or providing such utility meter alternatively as either one of a revenue meter or a watt-hour meter.

In other present respects, the present subject matter may be understood as having to do with integrating a service disconnect switch directly into the base of a meter so as to provide a dual functionality component. The integrated switch is configured so as to cooperate with, for example, current sensing components to provide a fixture to secure the current sensing core which can then focus a flux field onto a Hall cell mounted on the metrology printed circuit board.

Additional objects and advantages of the present subject matter are set forth in, or will be apparent to, those of ordinary skill in the art from the detailed description herein. Also, it should be further appreciated that modifications and variations to the specifically illustrated, referred, and discussed features, elements, and steps hereof may be practiced in various embodiments and uses of the present subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which.

Figure 1:
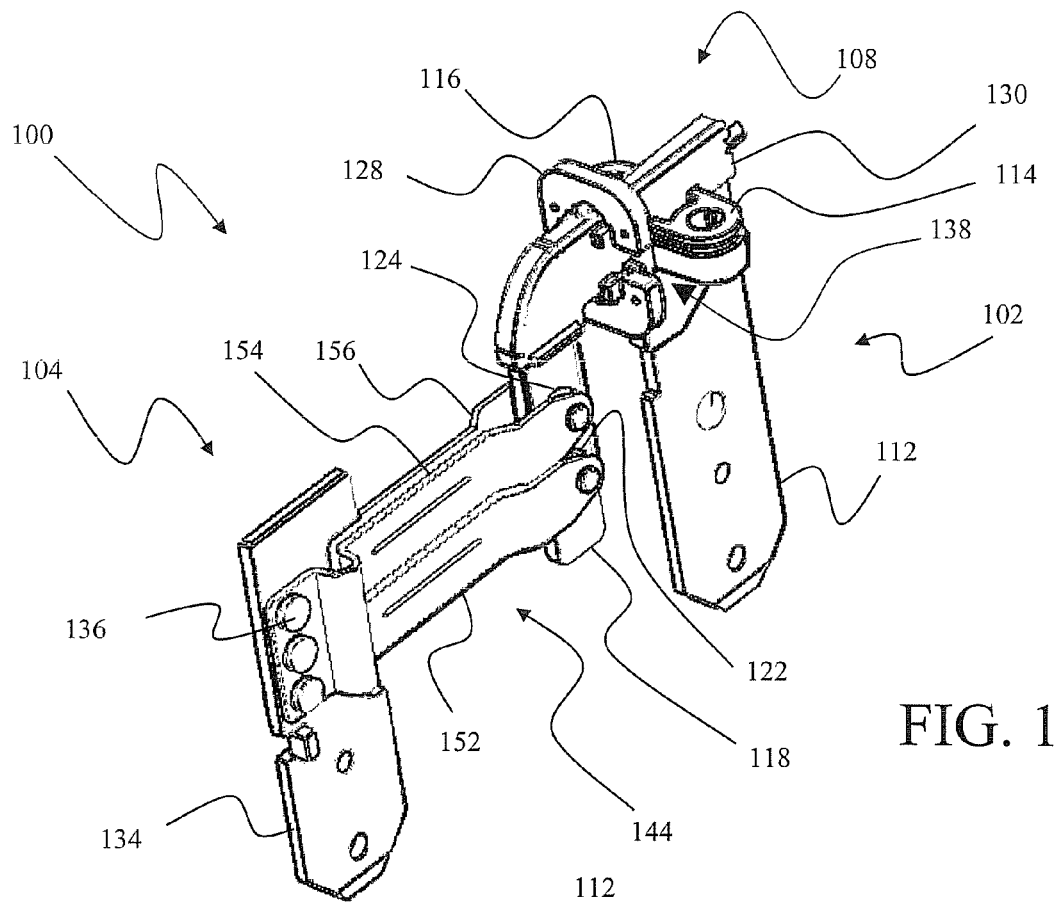
FIG. 1 illustrates exemplary mechanical current circuit elements in accordance with present technology prior to physical integration thereof within a meter assembly.

Repeat use of reference characters throughout the present specification and appended drawings is intended to represent same or analogous features, elements, or steps of the present subject matter.

DETAILED DESCRIPTION OF THE PREFERRED EMBODIMENTS

As discussed in the Summary of the Invention section, the present subject matter is particularly concerned with the physical integration of a high current switch device and an electricity meter. As have previously existed, there have been various meter types which may be used in the context of the present subject matter, which have been variously referred to as electricity meters, utility meters, revenue meters, watt-hour meters, and similar such designations. For purposes of the present disclosure, all such names are meant to designate a device used to measure consumption or generation of energy, more specifically, electrical energy, and may be used herein interchangeably and, in some instances, may simply be referred to as a meter.

Selected combinations of aspects of the disclosed technology correspond to a plurality of different embodiments of the present subject matter. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Reference will now be made in detail to the presently preferred embodiments of the subject compact meter with integrated high current switch subject matter. Referring to the drawings, FIG. 1 illustrates exemplary mechanical current circuit elements generally 100 prior to their integration within a present meter assembly. As illustrated, exemplary line side terminal assembly 102 corresponds, in part, to a line terminal 112 that, when integrated per present subject matter within a meter, is positioned to couple to a line terminal of a corresponding meter socket.

Exemplary line side terminal assembly 102 further corresponds to a conductive support 118 on which are mounted one or more contacts arranged to cooperate with one or more additional contacts so as to form a switch per present subject matter, as is discussed further below in greater detail. In an exemplary configuration, two contacts 122, 124 may be mounted on one side of conductive support 118, and two additional similarly positioned contacts (hidden in the presently discussed view), may be mounted on the other side.

The first and second portions of line side terminal assembly 102 are coupled together by way of a central conductive portion 108 on which is provided a fixture 130 for mounting a magnetic core 128. Magnetic core 128 is provided with a gap 138 positioned such that, when the mechanical current circuit elements 100 are integrated with a meter, gap 138 will be positioned in proximity to a metrology printed circuit board (not illustrated in detail) carrying a Hall cell such that magnetic core 128 and gap 138 will concentrate flux resulting from current flow through the mechanical current circuit elements 100 onto such Hall cell, which enables the metrology printed circuit board to generate measurement signals.

Fixture 130 may also include a pair of mounting tabs 114, 116, through which a securing device such as a threaded screw or equivalent member may pass to assist in securing the mechanical current circuit elements 100 to the meter base. Those of ordinary skill in the art will appreciate that other securing devices may be employed including, for example, providing a mounting post on the meter base over which mounting tabs 114, 116 may be placed and optionally secured in position by thermal welding or gluing of the posts to tabs 114, 116 or by other suitable means.

The present exemplary mechanical current circuit elements 100 also include a load side terminal assembly 104 corresponding, in part, to load side terminal 134 that, like line side terminal 112, is configured so that when integrated within a meter, it is positioned to couple to a load terminal of a corresponding meter socket. It is also positioned so as to couple further to one or more spring elements 144 secured at one end to load side terminal 134 and having a contact (hidden in present view) secured to the opposite end thereof and positioned such that the spring mounted contact comes into contact with one of the contacts (for example, contact 122 or 124) so as to form a closed electrical circuit.

In an exemplary configuration, four spring elements 152, 154, 156, 158 (spring element 158 is hidden here but may be seen in FIG. 2) may be provided and arranged such that two springs are positioned on either side of load side terminal 134 and secured thereto by any suitable means, such as by rivets 136. In such exemplary configuration, each of the four springs 152, 154, 156, 158 would also include a contact mounted to the other, unsecured end of the spring, and would be configured such that, when integrated with a meter, would be in alignment with a corresponding grouping of four contacts like contacts 122, 124 mounted to conductive support 118.

In this manner, current flowing through line terminal 112 and through the switch created by the four contact pairs, would be divided among the four spring elements 152, 154, 156, 158 on its way to load terminal 134. Such division of the current flow among the four separate paths significantly reduces the erosion of the contacts due to any separation-induced or closure-induced arcing.

Figure 5:
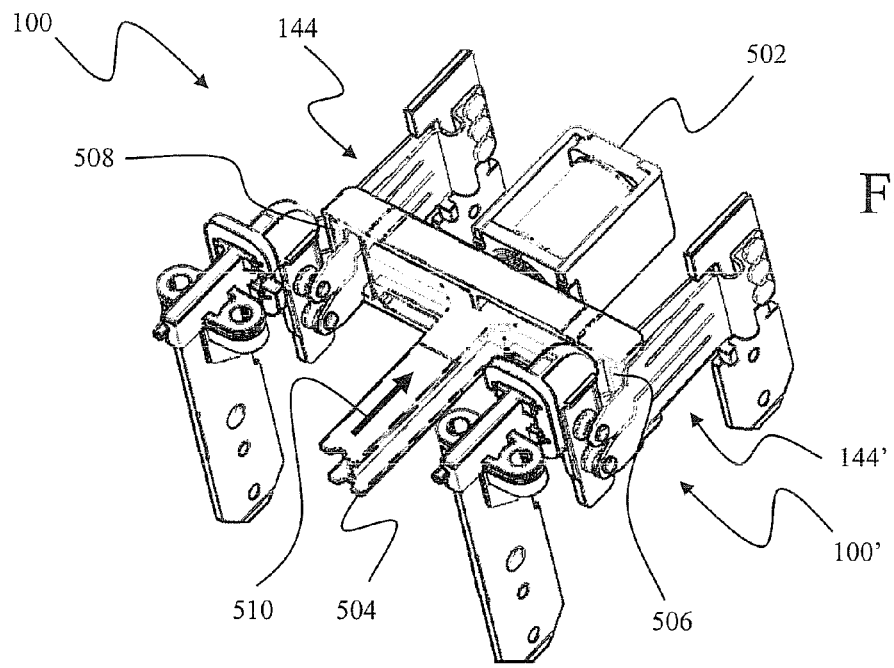
FIG. 5 illustrates a pair of exemplary mechanical current circuit elements in accordance with present technology prior to integration thereof within a meter assembly, for greater ease of component identification and for further illustrating a solenoid and associated wedge arranged to open the contacts of the mechanical current circuit elements.
Figure 6:
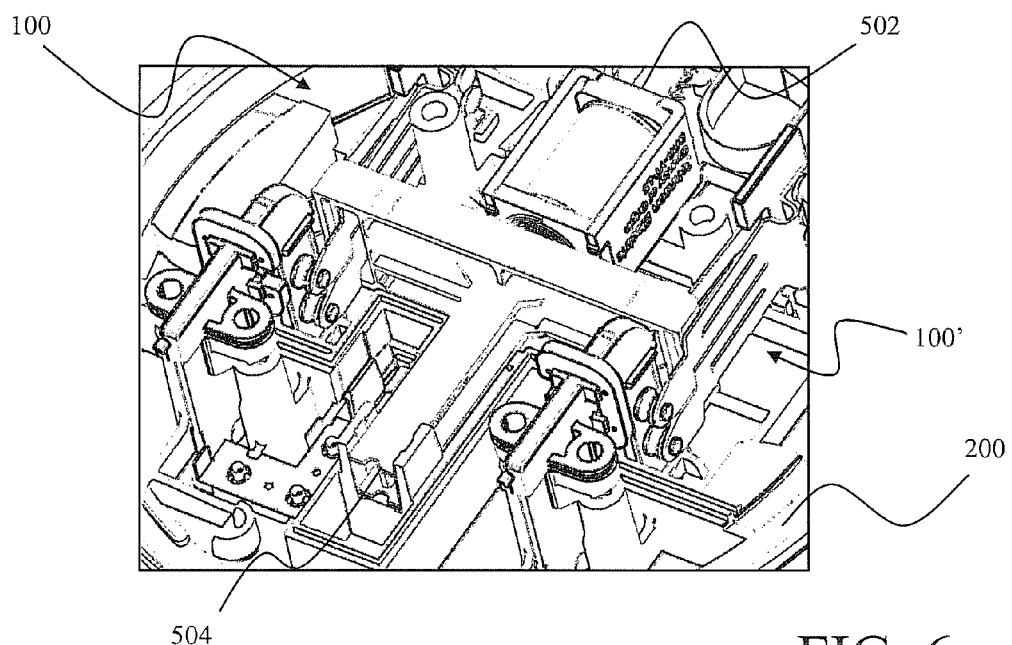
FIG. 6 illustrates a pair of exemplary mechanical current circuit elements in accordance with present technology fully integrated within in exemplary present meter assembly.

In accordance with the present technology, a wedge positioned between the spring elements 152, 154, 156, 158 (collectively referenced as spring elements 144) may be used to force the springs apart and thereby separate the contact pairs, as is more fully explained herein with reference to present FIGS. 5 and 6.

Figure 2:
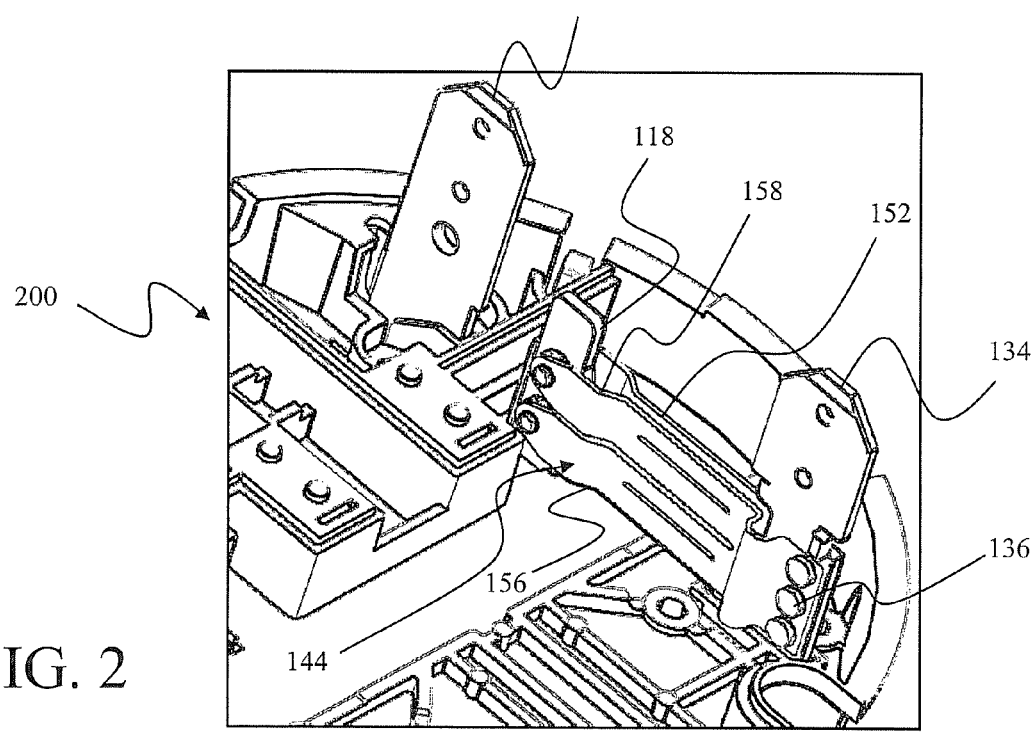
FIG. 2 illustrates an underneath view of a portion of an exemplary present meter base with the exemplary mechanical current circuit elements in place.

With reference to FIG. 2, there is illustrated an underneath view of a portion of a meter base 200 with present exemplary mechanical current circuit elements 100 integrated therein. Several of the illustrated components carry labels corresponding to previously discussed components so that their descriptions need not be repeated here. It should be noted that spring element 158, in particular, however, is visible in this view.

Figure 3:
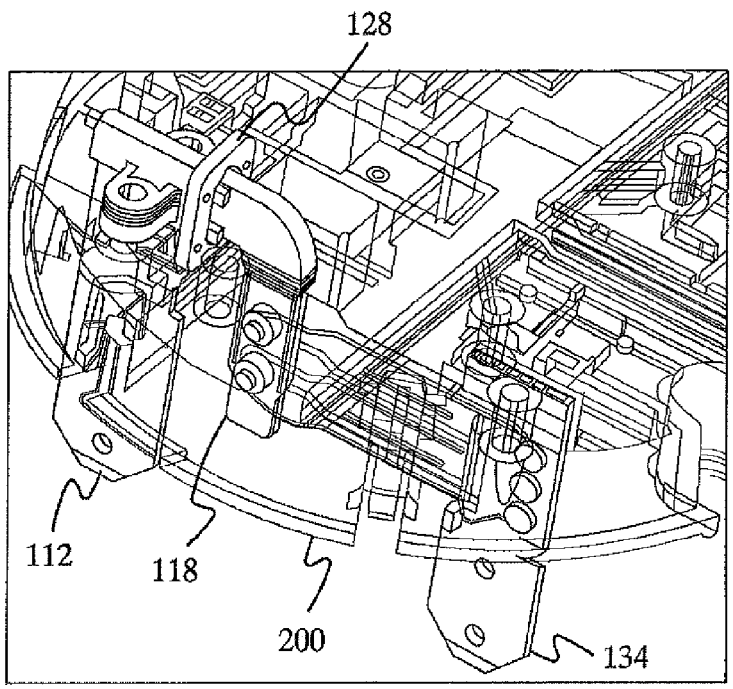
FIG. 3 illustrates a top oblique view of a portion of a present exemplary meter base with such meter base illustrated in phantom.
Figure 4:
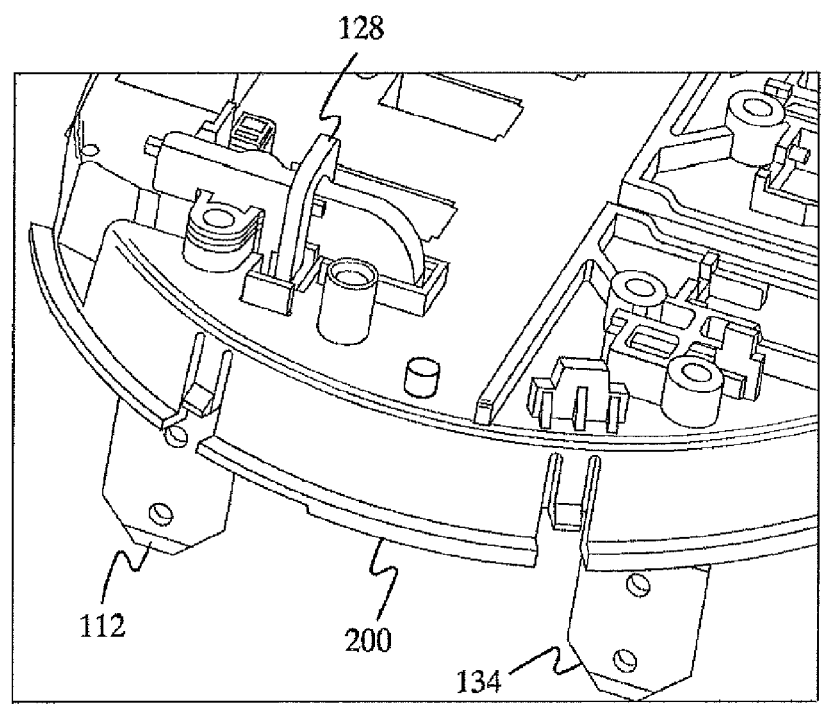
FIG. 4 illustrates a view similar to that of FIG. 3, but showing such present exemplary meter base in solid view.

With reference to FIGS. 3 and 4, similar views of an upper base portion 200 of a present exemplary meter are illustrated, again with similar, previously discussed components illustrated. In FIG. 3, meter base portion 200 appears in phantom so as to better illustrate placement of present exemplary mechanical current circuit elements 100 within meter base portion 200. FIG. 4 offers a similar view but illustrates meter base portion 200 in solid line.

With reference now to FIG. 5, there is illustrated a pair of mechanical current circuit elements 100, 100' in accordance with the present technology, prior to integration within an exemplary present meter assembly, for greater ease of component identification FIG. 5 further illustrates a solenoid generally 502 and an associated generally T-shaped wedge assembly 504 carrying at opposite ends of the top portion of the "T" a pair of wedges 506, 508 positioned between oppositely positioned pairs of exemplary spring members 144, 144'.

Wedges 506 and 508, upon energization of solenoid 502, are moved in the direction of arrow 510 so as to open the contacts of the exemplary mechanical current circuit elements 100, 100'. It should be appreciated by those of ordinary skill in the art that opening both lines to a residential split phase load, or opening the A and C phases for a three phase load, may be accomplished by the illustrated pair of mechanical current circuit elements 100, 100'.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A utility meter having a service disconnect switch integrated into the base thereof, said meter comprising:

a base integrally including high current circuit elements corresponding to a line side terminal assembly and a load side terminal assembly, each respectively configured for insertion into a utility meter socket;

a conductive support coupled to said line side terminal assembly;

contacts supported on said conductive support;

at least two pairs of spring elements respectively connected at one end thereof to the meter load terminal, with the opposite ends of said spring elements carrying contacts configured for cooperation with said contacts supported on said conductive support, so as to form contact pairs of a switch;

a flux-concentrating current sensing core supported on said conductive support for measurement of current flow through said high current circuit elements;

a solenoid having a movable actuator; and an insulative wedge configured to be moved by said movable actuator for travel between portions of the spring element pairs to thereby separate corresponding contact pairs, for interrupting any current flow through said high current circuit elements.

2. A utility meter as in claim 1, further including:

two pairs of said contact pairs, configured such that current flowing from said line side terminal assembly to said load side terminal assembly is divided into two sets of two parallel paths, respectively situated on each side of said conductive support; and a pair of said wedges respectively associated with said movable actuator and configured so as to respectively separate said contact pairs.

3. A utility meter as in claim 1, wherein said utility meter comprises one of a revenue meter and a watt-hour meter, and is further configured for collecting utility usage data for one or more of electricity, natural gas, and water consumption.

4. A utility meter as in claim 1, wherein said high current circuit elements include a respective pair of such elements configured for association, via a utility meter socket, with one of both lines of a residential split phase load, and two phases of a three phase load.

5. A metrology device having a high current switching circuit integrated therein, said metrology device comprising:

respective line and load terminals forming a portion of a high current switch, and respectively configured for insertion into an electricity meter socket, so as to integrally function as high current carrying conductors and a portion of circuit interruption mechanics;

a conductive support coupled to said line terminal, and supporting at least a pair of contacts thereon;

a flux-concentrating current sensing core supported on said conductive support for measurement of current flow through said high current carrying conductors; and at least a pair of spring elements respectively connected at one end thereof to said load terminal, with the opposite ends of said spring elements carrying contacts configured for cooperation with said contacts supported on said conductive support, so as to form a contact pair of a switch, configured to be separated by a selectively movable insulative member associated therewith, for selective interruption of high current carried by said terminals.

6. A metrology device as in claim 5, further including:

an insulative wedge comprising a selectively movable insulative member in selective contact with said spring elements for separating said switch contact pair; and a solenoid having a movable actuator, configured for selectively moving said insulative wedge.

7. A metrology device as in claim 5, further including:

two pairs of said switch contact pairs, configured such that current flowing from said line terminal to said load terminal is divided into two sets of two parallel paths, respectively situated on each side of said conductive support; and a pair of said insulative wedges respectively associated with said movable actuator and configured so as to respectively separate said contact pairs.

8. A metrology device as in claim 5, further including:

an electricity metering metrology board having a Hall cell mounted thereon;

said flux-concentrating current sensing core supported on said conductive support for measurement of current flow through said high current carrying conductors by focusing a flux field onto said Hall cell mounted on said metrology board; and at least four contact pairs and two pairs of spring elements, provided with one contact of each of said four pairs positioned on a contact supporting bar coupled to said line terminal and the other contact of each of said four pairs of contacts positioned on one end of one of said four spring members, while the respective other end of each of said four spring members is attached to said load terminal.

9. Methodology for compactly integrating a high current switching circuit into the base of a utility meter, said methodology comprising:

providing respective line and load terminals in the base of a utility meter, forming a portion of a high current switch, and respectively configured for insertion into an electricity meter socket, so as to integrally function as high current carrying conductors and a portion of circuit interruption mechanics;

coupling a conductive support to the line terminal; such conductive support comprising a flux-concentrating current sensing core supported on such conductive support for measurement of current flow through such high current carrying conductors;

supporting at least a pair of contacts on such conductive support;

respectively connecting at least a pair of spring elements at one end thereof to the load terminal, with the opposite ends of such spring elements carrying contacts configured for cooperation with the contacts supported on the conductive support, so as to form at least one contact pair of a switch; and selectively separating such contact pair, for selective interruption of high current carried by such terminals, whereby such terminals are providing with dual functionality, resulting in a compact utility meter design.

10. Methodology as in claim 9, further including:

providing an insulative wedge comprising a selectively movable insulative member for selective contact with such spring elements for separating such switch contact pair; and providing a solenoid having a movable actuator, configured for selectively moving said insulative wedge.

11. Methodology as in claim 9, further including providing in pairs the spring members supporting contacts on one end thereof such that current flowing from the line terminal to the load terminal is divided into two sets of two parallel paths, respectively situated on each side of the conductive support, to reduce contact erosion due to any separation-induced or closure-induced arcing.

12. Methodology as in claim 9, further including:

providing a second pair of said terminals respectively configured for association, via a utility meter socket, with one of both lines of a residential split phase load, and two phases of a three phase load; and wherein such utility meter comprises one of a revenue meter and a watt-hour meter.

* * * * *